United States Patent [19]

Yoshida et al.

[11] Patent Number: 5,093,284
[45] Date of Patent: Mar. 3, 1992

[54] PROCESS FOR HOMOGENIZING COMPOUND SEMICONDUCTOR SINGLE CRYSTAL IN PROPERTIES

[75] Inventors: Masato Yoshida; Kazushi Shimizu; Kenzo Susa; Hiroyuki Ishibashi, all of Tsukuba, Japan

[73] Assignee: Hitachi Chemical Company, Ltd., Tokyo, Japan

[21] Appl. No.: 355,349

[22] Filed: May 23, 1989

[30] Foreign Application Priority Data

May 27, 1988 [JP] Japan .................. 63-131146
May 27, 1988 [JP] Japan .................. 63-131147

[51] Int. Cl.⁵ .......................................... H01L 21/02
[52] U.S. Cl. .................................. 437/235; 437/236; 437/237; 437/247; 437/248
[58] Field of Search .............. 437/248, 237, 235, 247, 437/236

[56] References Cited

U.S. PATENT DOCUMENTS

| | | | |
|---|---|---|---|
| 3,984,263 | 10/1976 | Asao et al. | 437/247 |
| 4,174,982 | 11/1979 | Immorlica, Jr. | 437/247 |
| 4,194,927 | 3/1980 | Takagi et al. | 437/244 |
| 4,357,180 | 11/1982 | Molnar | 437/247 |
| 4,595,423 | 6/1986 | Miyazawa et al. | 437/247 |

FOREIGN PATENT DOCUMENTS

| | | | |
|---|---|---|---|
| 0032643 | 3/1982 | Japan | 437/247 |
| 0171300 | 9/1985 | Japan | 437/247 |
| 216542 | 10/1985 | Japan . | |

Primary Examiner—Brian E. Hearn
Assistant Examiner—Trung Dang
Attorney, Agent, or Firm—Antonelli, Terry, Stout & Kraus

[57] ABSTRACT

Properties of a compound semiconductor single crystal (e.g. GaAs single crystal) can be homogenized by subjecting the single crystal covered with a metal oxide powder (e.g. $Ga_2O_3$ powder) to a heat treatment.

3 Claims, 1 Drawing Sheet

PROCESS FOR HOMOGENIZING COMPOUND SEMICONDUCTOR SINGLE CRYSTAL IN PROPERTIES

BACKGROUND OF THE INVENTION

This invention relates to a process for homogenizing a compound semiconductor single crystal in various properties such as electrical, electronic and optical properties.

Semiconductor substrate crystals produced by a liquid encapsulated Gzochralski (LEC) method or a horizontal Bridgman method usually have various properties such as electrical properties heterogenously distributed in (100) plane used in integrated circuits. In order to homogenize these properties, there have been proposed various processes.

For example, in the case of a gallium arsenide (GaAs) single crystal, since arsenic (As) is released from the surface of an ingot or wafer, a heat treatment is carried out in an arsenic atmosphere in order to prevent the release of the arsenic (e.g. Japanese Journal of Applied Physics vol. 8, No. 8, p. 1000, 1969). But, according to this process, it is difficult to control the arsenic pressure and to handle poisons.

SUMMARY OF THE INVENTION

It is an object of the present invention to provide a process for homogenizing various properties of a compound semiconductor single crystal effectively by an easy heat treatment.

The present invention provide a process for homogenizing a compound semiconductor single crystal in properties which comprises covering a compound semiconductor single crystal with a powder which reacts with the compound semiconductor single crystal upon heating and forms a film of the reaction product on the surface of the compound semiconductor single crystal, and heating the powder-covered compound semi-conductor single crystal, followed by cooling.

DESCRIPTION OF THE PREFERRED EMBODIMENTS

As the compound semiconductor single crystal, there can be used a single crystal of GaAs, GaP, InP, CdTe, or the like, obtained by a conventional method such as a liquid encapsulated Czochralski method, a horizontal Bridgman method, etc.

As the powder which reacts with the compound semiconductor single crystal upon heating and forms a film of the reaction product on the surface of the compound semiconductor single crystal, there can be used metal oxide powders. From the viewpoint of preventing contamination of the compound semiconductor single crystal with impurities, the use of oxides of the same elements as those constituting the compound semiconductor single crystal.

For examples, there can be used powders of $Ga_2O_3$, $SiO_2$, etc. in the case of single crystals of GaP and InP; powders of $SiO_2$, CdO, ZnO, etc. in the case of single crystal of CdTe; and $Ga_2O_3$, $SiO_2$, $Al_2O_3$, etc. in the case of single crystal of GaAs.

It is preferable to use metal oxide powders having a small particle size, such as 50 to 0.5 $\mu m$. These metal oxide powders are used so as to have good contact with the compound semiconductor single crystal in the form of wafer or ingot with a sufficient amount to cover the wafer or ingot and to make contact with air as small as possible. As a result, release of arsenic (As) or the like can be prevented.

The heat treatment of compound semiconductor single crystal can preferably be carried out under vacuum. It is possible to carry out the heat treatment in a stream of air, an inert gas such as orgon or nitrogen gas, etc., or under a reduced pressure (e.g. 1 to 10 pascals).

The heat treatment of heating and cooling can be carried out repeating heating and cooling several times. The heating temperature is usually 1200° to 240° C., preferably 1100° to 500° C., more preferably 900° to 650° C., and selected properly depending on purposes.

Heating time is usually 1 to 72 hours and selected properly depending on purposes.

In the heat treatment, it is sufficient when the compound semiconductor single crystal is covered with a powder at least in the temperature range wherein vaporization of single crystal-constituting elements takes place. Covering of the single crystal can be attained, for example, by inserting a single crystal in a powder or by forming a pellet by compressing a powder-covered wafer or ingot.

Figure 1:
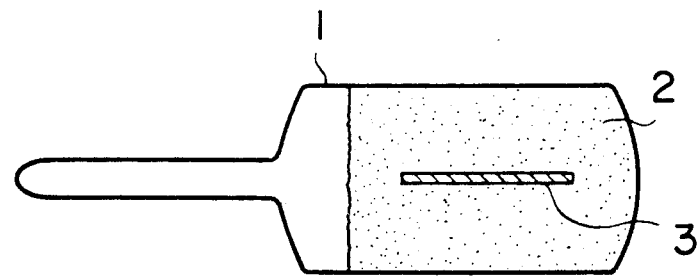
FIGS. 1 and 2 are plane views, partially cross-sectional, of quartz ampules illustrating the process of the present invention.
Figure 2:
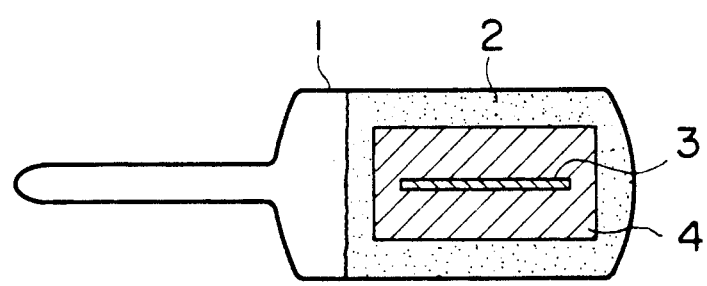

The process of the present invention is explained referring to the drawings. In FIG. 1, a single crystal wafer 3 is placed in a quartz ampule 1, which is then filled with a metal oxide powder 2 and vacuum sealed. The ampule is subjected to a heat treatment of heating and rapid cooling. In FIG. 2, a pellet 4 obtained by compressing a whole of a wafer 3 covered with a metal oxide is placed in a quartz ampule 1, which is further filled with a metal oxide powder 2 and vacuum sealed. By this, contact of the wafer with gas phase (air, Ar, $N_2$, etc.) can further be prevented.

The effect of the present invention can further be improved by making the volume of gas phase in the ampule as small as possible.

It is possible to use a single crystal ingot in place of the wafer. This is advantageous from the industrial point of view.

Figure 3:
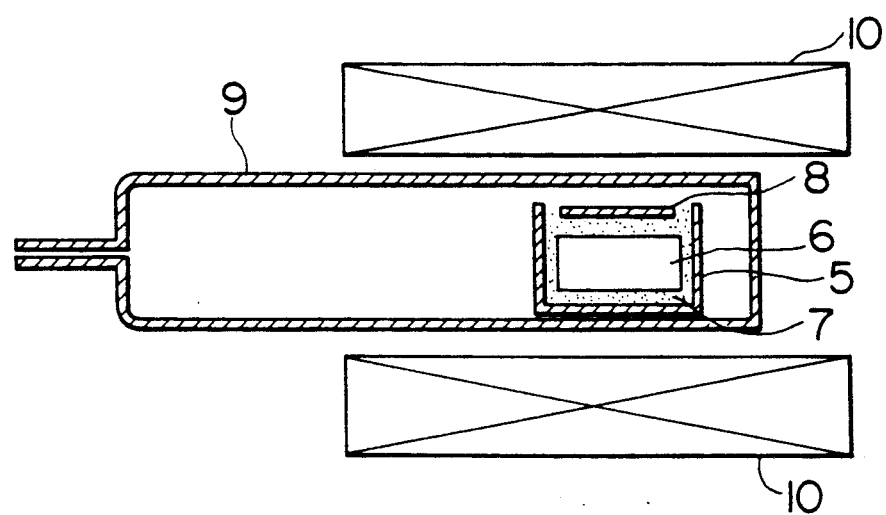
FIG. 3 is a cross-sectional view of an apparatus used for the process of the present invention.

FIG. 3 shows another example for carrying out the present invention. In FIG. 3, a single crystal ingot 6 is placed in a quartz petri dish 5 together with a metal oxide powder 7 so as to cover the ingot. Then, a lid 8 made of quartz is placed thereon. The resulting quartz petri dish is placed in a quartz tube 9 (inner diameter 10 cm) and subjected to heat treatment under a reduced pressure (e.g. 1 to 10 pascals). Numeral 10 denotes an electric furnace for heating.

In the present invention, it seems that some surface reaction takes place during the heat treatment by covering the compound semiconductor single crystal with a special powder to cover the single crystal with a thin film, which results in preventing the single crystal from release of arsenic, etc.

This invention is illustrated by way of the following Examples.

EXAMPLE 1

A whole of GaAs single crystal wafer cut into 6 mm long, 6 mm wide and 0.5 mm thick was covered with a $Ga_2O_3$ powder (average particle size 1.2 μm). The wafer had been etched on the surface in about 10 μm with an etchant of $H_2SO_4$ $H_2O_2$ $H_2O = 3:1:1$. The powder-covered wafer was placed in a quartz ampule as shown in FIG. 1 and vacuum sealed. After heating at 677° C. for 46 hours, the ampule was rapidly cooled. The wafer was taken out of the ampule. The wafer was covered with a thin (several μm) amorphous film and gallium oxide powder was retained therearound. The amorphous film was composed of gallium oxide and an amorphous substance, when measured by an X-ray.

After etching the heat treated wafer in 50 μm using the same etchant as mentioned above, electrical properties were measured. By the heat treatment, the resistivity was changed from $3.4 \times 10^8$ Ω.cm to $2.1 \times 10^8$ Ω.cm, the carrier concentration was changed from $6 \times 10^6$ $cm^{-3}$ to $1 \times 10^7 cm^{-3}$, and the mobility was retained at 3200 $cm^2/v$ s. (v.s. = volt. sec.).

For comparison, when the wafer was not covered with the powder, the resistivity became $1 \times 10^4$ ω.cm, the carrier concentration became $2 \times 10^{14} cm^{-3}$, and the mobility became 2 $cm^2/v.s$. This means that arsenic is clearly released from the wafer surface.

Therefore, the present invention is effective for preventing the release of As from the single crystal surface.

EXAMPLE 2

A whole of GaAs single crystal wafer cut into 6 mm long, 6 mm wide and 0.7 mm thick was covered with silicon oxide powder (average particle size 1 μm). The wafer had been etched on the surface in about 10 μm with an etchant of $H_2SO_4$: $H_2O_2$: $H_2O = 3:1:1$. The powder-covered wafer was placed in a quartz ampule as shown in FIG. 1 and vacuum sealed. After heating at 677° C. for 24 hours, the ampule was rapidly cooled. The wafer was taken out of the ampule. The wafer was covered with a thin (several μm) amorphous film and silicon oxide powder was retained therearound. The amorphous film was composed of gallium oxide and an amorphous substance, when measured by an X-ray diffractometry.

After the heat treatment, the wafer was washed sufficiently and subjected to measurement of electrical properties. By the heat treatment, the resistivity was changed from $3.4 \times 10^8$ Ω.cm to $2.5 \times 10^8$ ω.cm; the carrier concentration was changed from $6 \times 10^8 cm^{-3}$ to $1 \times 10^7 cm^{-3}$, and the mobility was changed from 3200 to 2600 $cm^2/v.s$.

For comparison, when the wafer was not covered with the powder, the resistivity became $1 \times 10^4$ Ω.cm, the carrier concentration became $2 \times 10^{14} cm^{-3}$, and the mobility became 2 $cm^2/v.s$. This means that arsenic is clearly released from the wafer surface.

Therefore, the present invention is effective for preventing the release of arsenic from the single crystal surface.

EXAMPLE 3

A whole of GaAs single crystal cut into 6 mm long, 6 mm wide and 0.7 mm thick was covered with aluminum oxide powder (average particle size 5 μm). The wafer had been etched on the surface in about 10 μm with an etchant of $H_2SO_4$: $H_2O_2$ : $H_2O = 3:1:1$. The powder-covered wafer was placed in a quartz ampule as shown in FIG. 1 and vacuum sealed. After heating at 677° C. for 24 hours, the ampule was rapidly cooled. The wafer was taken out of the ampule. The wafer was covered with a thin film (several μm) amorphous film and aluminum oxide powder was retained therearound. The amorphous film was composed of gallium oxide and an amorphous substance, when measured by an X-ray diffractometry.

After the heat treatment, the wafer was washed sufficiently and subjected to measurement of electrical properties. By the heat treatment, the resistivity was changed from $3.4 \times 10^8$ Ω.cm to $1 \times 10^6$ Ω.cm; the carrier concentration was changed from $6 \times 10 cm^{-3}$ to $8 \times 10^{10} cm^{-3}$, and the mobility was changed from 3200 to 80 $cm^2/v.s$.

For comparison, when the wafer was not covered with the powder, the resistivity became $1 \times 10^4$ Ω.cm, the carrier concentration became $2 \times 10^{14} cm^{-3}$, and the mobility became 2 $cm^2/v$ s. This means that arsenic is clearly released from the wafer surface.

Therefore, the present invention is effective for preventing the release of arsenic from the single crystal surface.

As mentioned above, various properties of compound semiconductor single crystals, e.g. electrical, electronic and optical peoperties, can be homogenized effectively by an easy procedure.

What is claimed is:

1. A process for homogenizing a compound semiconductor single crystal in properties which comprises:
    covering a compound semiconductor single crystal with a powder which reacts with the compound semiconductor single crystal upon heating and forms a film of the reaction product of the compound semiconductor single crystal and the powder on the surface of the compound semiconductor single crystal, and heating the powder-covered compound semiconductor single crystal, following by cooling; the compound semiconductor single crystal being GaAs single crystal and the powder being a $Ga_2O_3$ powder.

2. A process for homogenizing a compound semiconductor single crystal in properties which comprises:
    covering a whole surface of a compound semiconductor single crystal with a metal oxide powder which reacts with the compound semiconductor single crystal upon heating and forms a film of the reaction product on the surface of the compound semiconductor single crystal, and heating the powder-covered compound semiconductor single crystal under a reduced pressure of 1 to 10 pascals, at 1,200 to 240° C. followed by cooling; the compound semiconductor single crystal being GaAs single crystal and the power being a $Ga_2O_3$ powder.

3. A process according to claim 1, wherein the powder-covered compound semiconductor single crystal is heated at 1200° to 240° C.

* * * * *